US012633320B2

(12) United States Patent
Choi et al.

(10) Patent No.: US 12,633,320 B2
(45) Date of Patent: May 19, 2026

(54) MEMORY DEVICE AND METHOD OF MANUFACTURING THE SAME

(71) Applicant: SK hynix Inc., Icheon-si (KR)

(72) Inventors: Won Geun Choi, Icheon-si (KR); Jeong Hwan Kim, Icheon-si (KR); Jung Shik Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 115 days.

(21) Appl. No.: 18/517,970

(22) Filed: Nov. 22, 2023

(65) Prior Publication Data

US 2024/0420740 A1     Dec. 19, 2024

(30) Foreign Application Priority Data

Jun. 16, 2023     (KR) ........................ 10-2023-0077521

(51) Int. Cl.
 *G11C 16/04*     (2006.01)
 *G11C 5/06*     (2006.01)
 *H10B 43/10*     (2023.01)
 *H10B 43/27*     (2023.01)

(52) U.S. Cl.
 CPC ............. *G11C 5/063* (2013.01); *H10B 43/10* (2023.02); *H10B 43/27* (2023.02)

(58) Field of Classification Search
 CPC ......... G11C 5/063; H10B 43/10; H10B 43/27
 See application file for complete search history.

(56) References Cited

U.S. PATENT DOCUMENTS

| 7,505,318 | B2 * | 3/2009 | Fukuda .............. G11C 16/0483 |
| | | | 365/185.11 |
| 8,050,127 | B2 * | 11/2011 | Lee .......................... G11C 7/18 |
| | | | 365/207 |
| 8,699,255 | B2 | 4/2014 | Yu et al. |
| 8,969,945 | B2 | 3/2015 | Kito et al. |
| 9,406,351 | B2 | 8/2016 | Stansfield |
| 9,552,896 | B2 | 1/2017 | Oh |
| 10,079,056 | B2 | 9/2018 | Gupta et al. |
| 10,699,761 | B2 | 6/2020 | Berger et al. |
| 11,526,285 | B2 | 12/2022 | Wang et al. |
| 2008/0315281 | A1 * | 12/2008 | Park ..................... H10D 64/017 |
| | | | 257/E21.294 |

(Continued)

FOREIGN PATENT DOCUMENTS

| KR | 1020200073339 A | 6/2020 |
| KR | 1020210084678 A | 7/2021 |
| KR | 1020220098088 A | 7/2022 |

*Primary Examiner* — Pho M Luu
(74) *Attorney, Agent, or Firm* — WILLIAM PARK AND ASSOCIATES LTD.

(57)     ABSTRACT

A memory device, and a method of manufacturing the same, includes a first select line including a first cell area, a second select line including a second cell area disposed in a first direction from the first cell area, a first separation pattern extending in a second direction intersecting the first direction between the first cell area and the second cell area, second separation patterns extending from both ends of the first separation pattern in the first direction and a third direction opposite the first direction, respectively, and a third separation pattern extending from at least one of the second separation patterns in the second direction, and disposed in a direction opposite the first separation pattern with respect to the at least one second separation pattern.

16 Claims, 15 Drawing Sheets

(56) References Cited

U.S. PATENT DOCUMENTS

| | | |
|---|---|---|
| 2011/0302354 A1 | 12/2011 | Miller |
| 2013/0135925 A1 | 5/2013 | Scheuerlein |
| 2017/0263308 A1 | 9/2017 | Gupta et al. |

* cited by examiner

M1
M2

A                                        A'

CP

+Z
+Y   +X

M1
M2

A                                        A'

CP

+Z
+Y   +X

MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2023-0077521 filed on Jun. 16, 2023, in the Korean Intellectual Property Office, the entire disclosure of which is incorporated by reference herein.

BACKGROUND

1. Technical Field

Various embodiments of the present disclosure generally relate to a memory device and a method of manufacturing the memory device, and more particularly, to a memory device and a method of manufacturing the memory device, which separate select lines from each other.

2. Related Art

A memory device may include a nonvolatile memory device in which stored data is maintained even if supplied power is cut off. The nonvolatile memory device may be classified as a two-dimensional (2D) structure or a three-dimensional (3D) structure according to a structure in which memory cells are arranged. Memory cells of the nonvolatile memory device having the 2D structure may be arranged on a substrate in a single layer, while memory cells of the nonvolatile memory device having the 3D structure may be vertically stacked on the substrate. Because the integration degree of the nonvolatile memory device having the 3D structure is higher than that of the nonvolatile memory device having the 2D structure, electronic devices using the nonvolatile memory device having the 3D structure are increasing.

SUMMARY

In accordance with an embodiment of the present disclosure is a memory device. The memory device may include a first select line including a first cell area, a second select line including a second cell area disposed in a first direction from the first cell area, a first separation pattern extending in a second direction intersecting the first direction between the first cell area and the second cell area, second separation patterns extending from both ends of the first separation pattern in the first direction and a third direction opposite the first direction, respectively, and a third separation pattern extending from at least one of the second separation patterns in the second direction, and disposed in a direction opposite the first separation pattern with respect to the at least one second separation pattern.

In accordance with another embodiment of the present disclosure is a method of manufacturing a memory device. The method may include forming a stacked body including a cell array area and a contact area, wherein the cell array area includes a first cell area and a second cell area that are spaced apart from each other in a first direction, and the contact area includes step structures formed on both sides of the cell array area. The method may also include forming a first trench that passes through a portion of the stacked body and extends in a second direction intersecting the first direction between the first cell area and the second cell area.

The method may further also include forming second trenches that pass through a portion of the stacked body and extend from both ends of the first trench in the first direction and a third direction opposite the first direction, respectively. The method may additionally include forming a third trench that passes through a portion of the stacked body and extends from at least one of the second trenches in the second direction and that is disposed in a direction opposite the first trench with respect to the at least one second trench. The method may also include forming an insulating material in the first trench, the second trenches, and the third trench.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Some embodiments of the present disclosure are directed to a memory device and a method of manufacturing the memory device, which can reduce difficulty in a process and decrease defects in the process. Various embodiments of the present disclosure will now be described in detail with reference to the accompanying drawings so that those skilled in the art can practice the technical spirit of the present disclosure.

Figure 1:
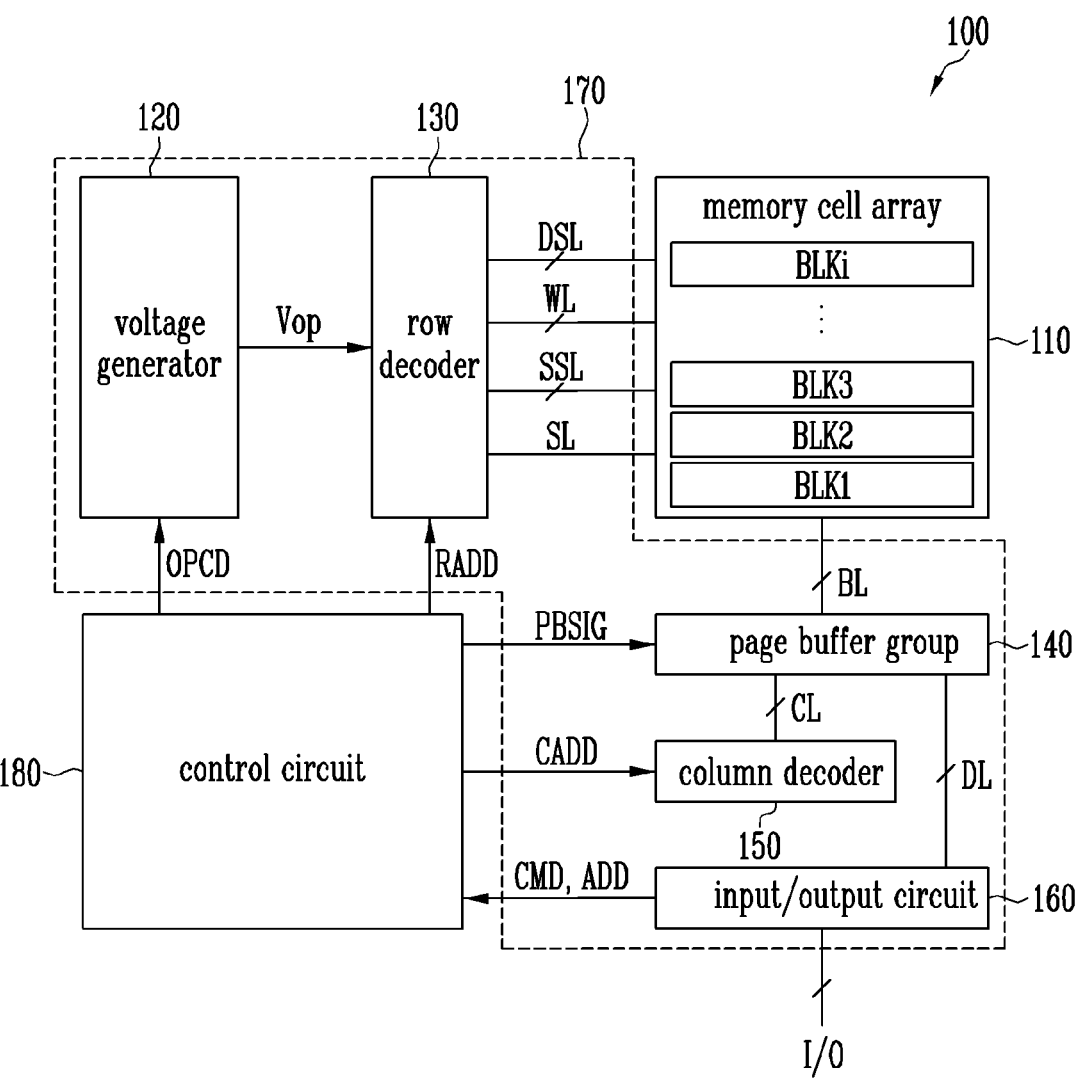
FIG. 1 is a diagram illustrating a memory device according to an embodiment of the present disclosure.

FIG. 1 is a diagram illustrating a memory device according to an embodiment of the present disclosure.

Referring to FIG. 1, a memory device 100 may include a memory cell array 110, a peripheral circuit 170, and a control circuit 180.

The memory cell array 110 may include first to i-th memory blocks BLK1 to BLKi. Each of the first to i-th memory blocks BLK1 to BLKi may include a plurality of memory cells that are capable of storing data. Drain select lines DSL, word lines WL, source select lines SSL, and a source line SL may be coupled to each of the first to i-th memory blocks BLK1 to BLKi, and bit lines BL may be coupled in common to the first to i-th memory blocks BLK1 to BLKi.

Each of the first to i-th memory blocks BLK1 to BLKi may be formed to have a three-dimensional (3D) structure. Each memory block having a 3D structure may include memory cells stacked in a direction vertical to a substrate.

According to a program scheme, each memory cell may store 1 bit of data or 2 or more bits of data. For example, a scheme for storing 1 bit of data in one memory cell is referred to as a single-level cell (SLC) scheme, and a scheme for storing 2 bits of data in one memory cell is referred to as a multi-level cell (MLC) scheme. A scheme for storing 3 bits of data in one memory cell is referred to as a triple-level cell (TLC) scheme, and a scheme for storing 4 bits of data in one memory cell is referred to as a quad-level cell (QLC) scheme. In addition, 5 or more bits of data may be stored in one memory cell.

The peripheral circuit 170 may perform a program operation of storing data in the memory cell array 110, a read operation of outputting data stored in the memory cell array 110, and an erase operation of erasing data stored in the memory cell array 110. For example, the peripheral circuit 170 may include a voltage generator 120, a row decoder 130, a page buffer group 140, a column decoder 150, and an input/output circuit 160.

The voltage generator 120 may generate various operating voltages Vop required for a program operation, a read operation, or an erase operation in response to an operation code OPCD. For example, the voltage generator 120 may generate program voltages, turn-on voltages, turn-off voltages, negative voltages, precharge voltages, verify voltages, read voltages, pass voltages, or erase voltages in response to the operation code OPCD. The operating voltages Vop generated by the voltage generator 120 may be applied to the drain select lines DSL, the word lines WL, the source select lines SSL, and the source line SL of a selected memory block through the row decoder 130.

The program voltages may be voltages that are applied to a selected word line among the word lines WL during a program operation, and may be used to increase the threshold voltages of memory cells coupled to the selected word line. The turn-on voltages may be applied to the drain select lines DSL or the source select lines SSL, and may be used to turn on drain select transistors or source select transistors. The turn-off voltages may be applied to the drain select lines DSL or the source select lines SSL, and may be used to turn off drain select transistors or source select transistors. For example, the turn-off voltage may be set to 0 V.

The precharge voltages are voltages higher than 0 V, and may be applied to the bit lines during a read operation. The verify voltages may be used for a verify operation of determining whether the threshold voltages of the selected memory cells have increased up to target levels. The verify voltages may be set to various levels depending on the target levels, and may be applied to the selected word line. The read voltages may be applied to the selected word line during a read operation on the selected memory cells. For example, the read voltages may be set to various levels according to the program scheme of the selected memory cells. The pass voltages may be voltages that are applied to unselected word lines, among the word lines WL, during a program or read operation, and may be used to turn on memory cells coupled to the unselected word lines. The erase voltages may be used for an erase operation of erasing the memory cells included in the selected memory block, and may be applied to the source line SL.

The row decoder 130 may transfer the operating voltages Vop to the drain select lines DSL, the word lines WL, the source select lines SSL, and the source line SL, which are coupled to a memory block selected in response to a row address RADD. For example, the row decoder 130 may be coupled to the voltage generator 120 through global lines, and may be coupled to the first to i-th memory blocks BLK1 to BLKi through the drain select lines DSL, the word lines WL, the source select lines SSL, and the source line SL.

The page buffer group 140 may include page buffers (not illustrated) coupled to the first to i-th memory blocks BLK1 to BLKi, respectively. For example, respective page buffers (not illustrated) may be coupled to the first to i-th memory blocks BLK1 to BLKi through bit lines BL. During a read operation, the page buffers (not illustrated) may sense currents or voltages of the bit lines that vary depending on the threshold voltages of selected memory cells in response to page buffer control signals PBSIG, and may temporarily store sensed data.

The column decoder 150 may be configured such that data is transferred between the page buffer group 140 and the input/output circuit 160 in response to a column address CADD. For example, the column decoder 150 may be coupled to the page buffer group 140 through column lines CL, and may transmit enable signals through the column lines CL. The page buffers (not illustrated) included in the page buffer group 140 may receive or output data through data lines DL in response to the enable signals.

The input/output circuit 160 may receive or output a command CMD, an address ADD, or data through input/output lines I/O. For example, the input/output circuit 160 may transmit the command CMD and the address ADD, received from an external controller through the input/output lines I/O, to the control circuit 180, and may transmit the data, received from the external controller through the input/output lines I/O, to the page buffer group 140. Alternatively, the input/output circuit 160 may output data, received from the page buffer group 140, to the external controller through the input/output lines I/O.

The control circuit 180 may output at least one of the operation code OPCD, the row address RADD, the page buffer control signals PBSIG, or the column address CADD in response to the command CMD and the address ADD. For example, when the command CMD input to the control circuit 180 is a command corresponding to a program operation, the control circuit 180 may control the peripheral circuit 170 so that a program operation is performed on a memory block selected by the address ADD. When the command CMD input to the control circuit 180 is a command corresponding to a read operation, the control circuit 180 may control the peripheral circuit 170 so that a read operation is performed on a memory block selected by the address and read data is output. When the command CMD input to the control circuit 180 is a command corresponding to an erase operation, the control circuit 180 may control the peripheral circuit 170 so that an erase operation is performed on a selected memory block.

Figure 2:
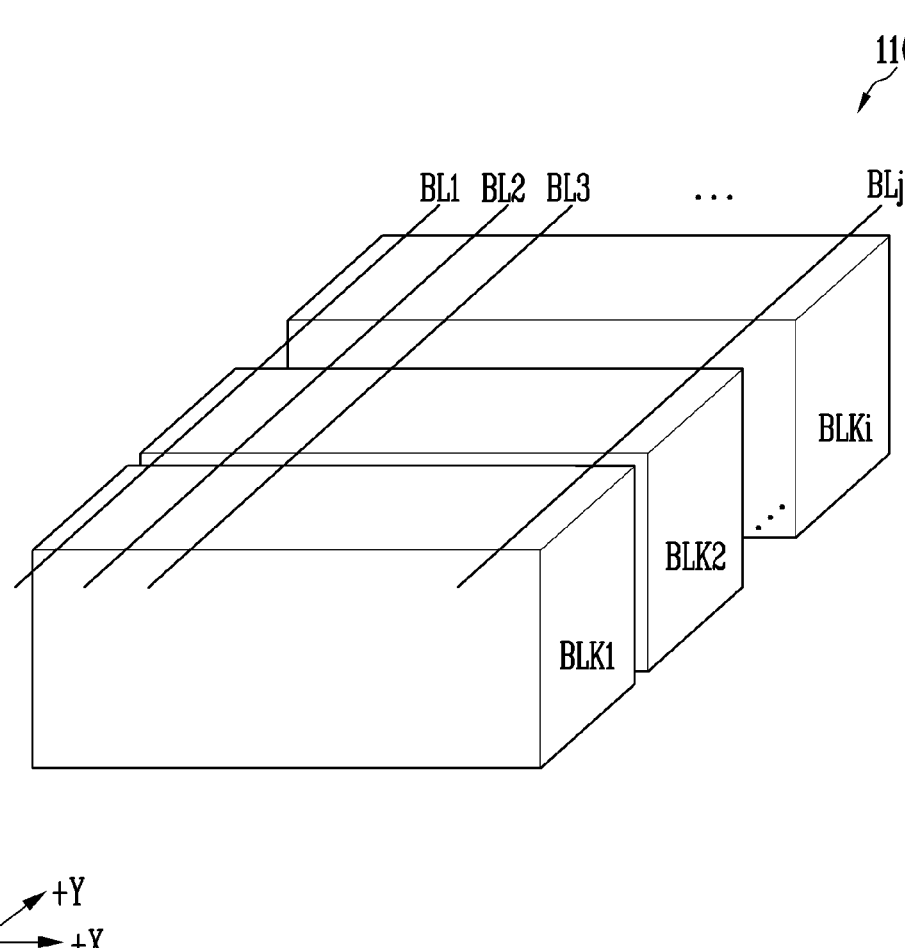
FIG. 2 is a diagram illustrating the structure of a memory cell array according to an embodiment of the present disclosure.

FIG. 2 is a diagram illustrating the structure of a memory cell array according to an embodiment of the present disclosure.

Referring to FIG. 2, the memory cell array 110 may include the first to i-th memory blocks BLK1 to BLKi. The first to i-th memory blocks BLK1 to BLKi may be arranged to be spaced apart from each other along a Y axis. The first to i-th memory blocks BLK1 to BLKi may extend along an X axis.

The first to i-th memory blocks BLK1 to BLKi may be coupled in common to first to j-th bit lines BL1 to BLj. For example, the first to j-th bit lines BL1 to BLj may extend along the Y axis, and may be arranged to be spaced apart from each other along the X axis. The first to j-th bit lines BL1 to BLj may be coupled, respectively, to the first to i-th memory blocks BLK1 to BLKi on the first to i-th memory blocks BLK1 to BLKi.

Figure 3A:
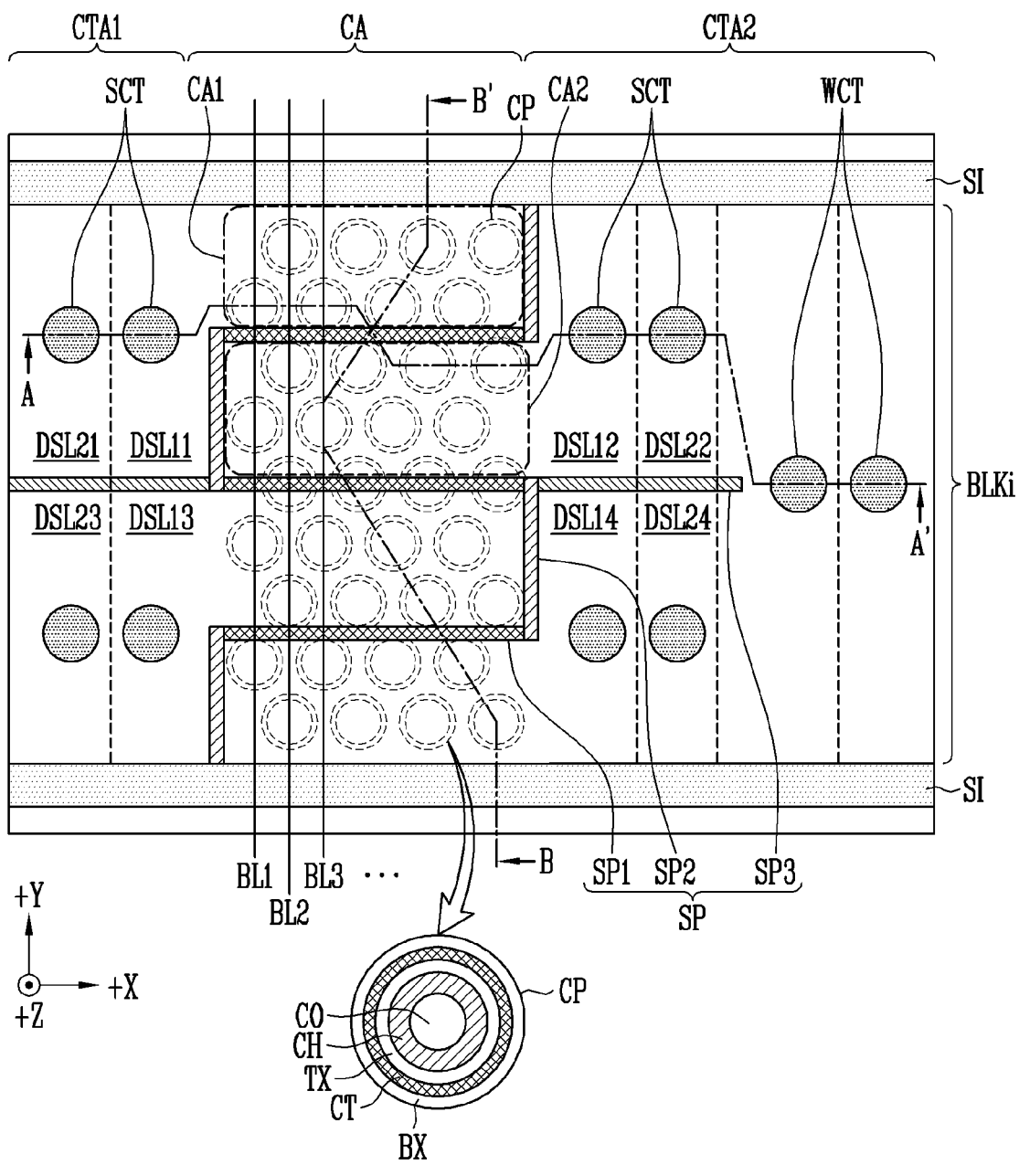
FIGS. 3A to 3E are views illustrating the structure of a memory device according to an embodiment of the present disclosure.
Figure 3B:
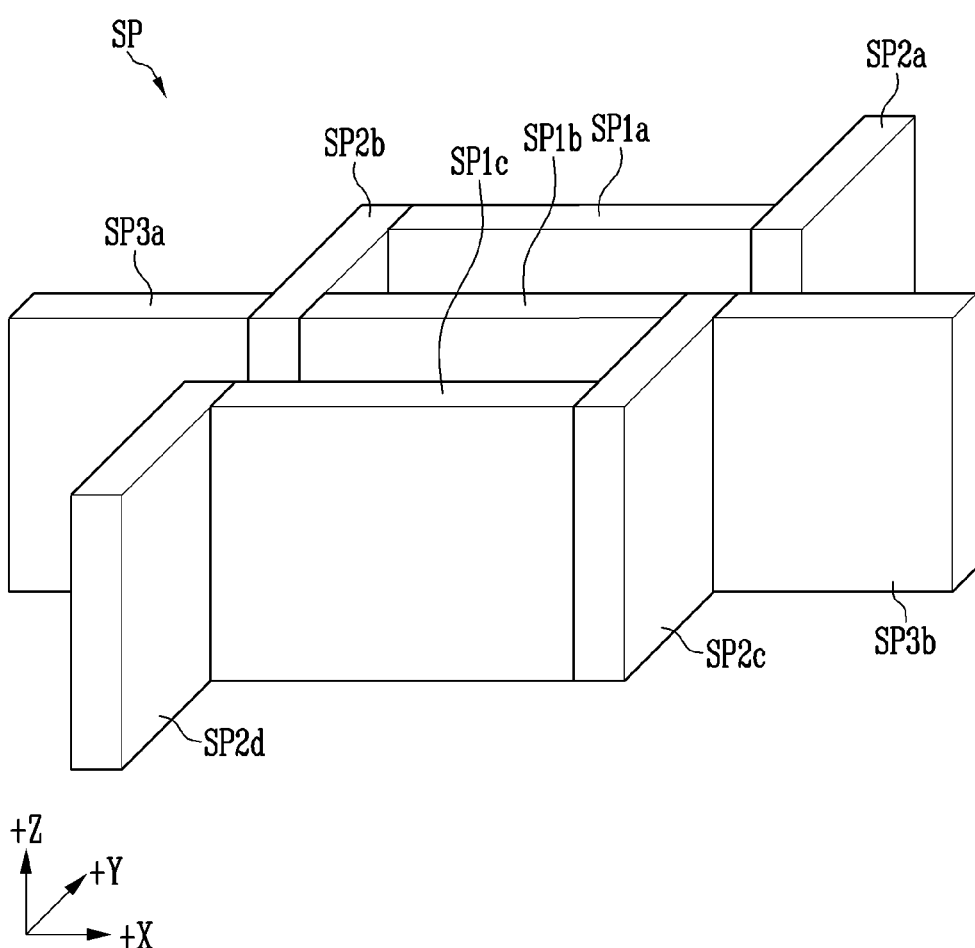
Figure 3C:
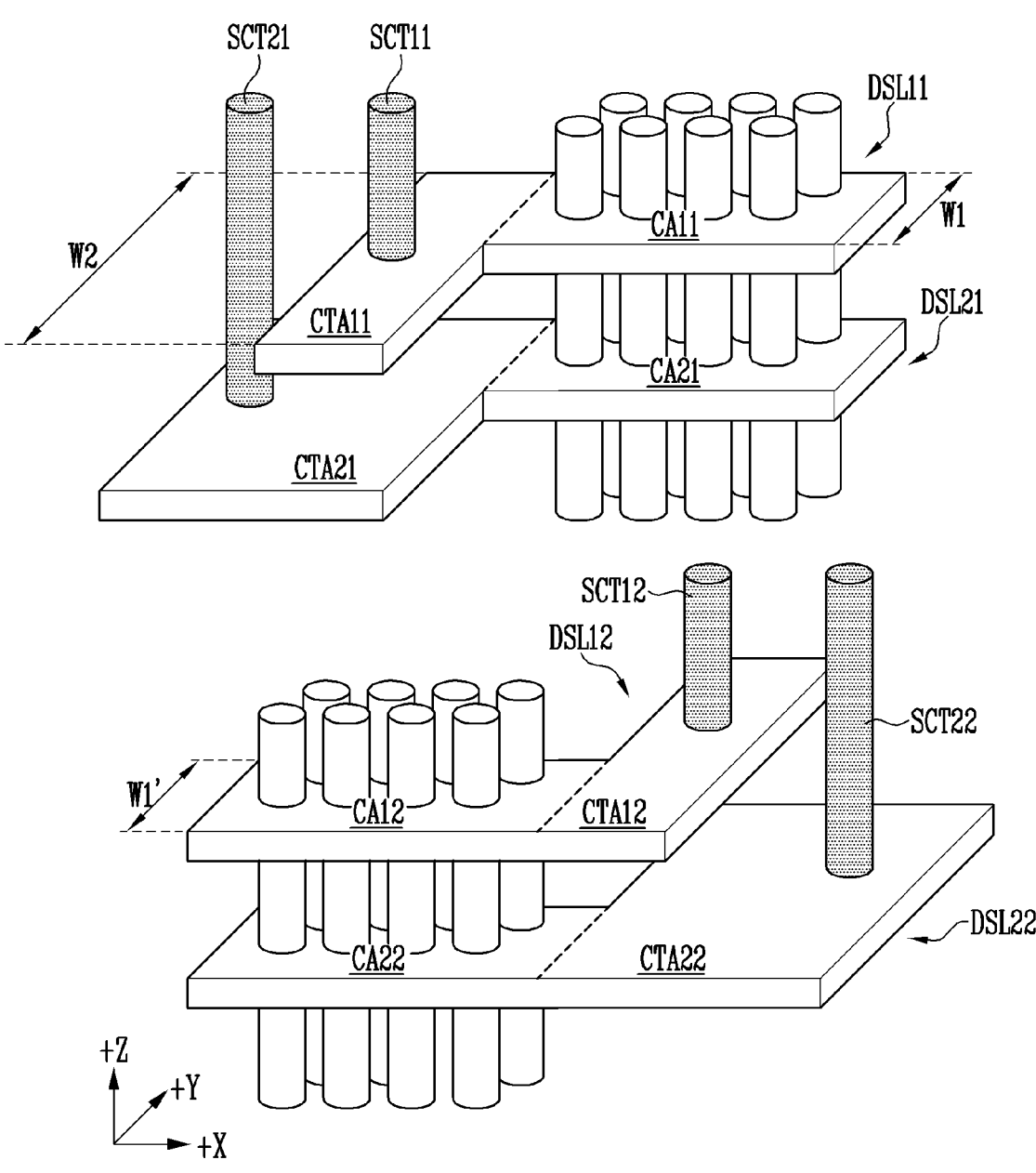
Figure 3D:
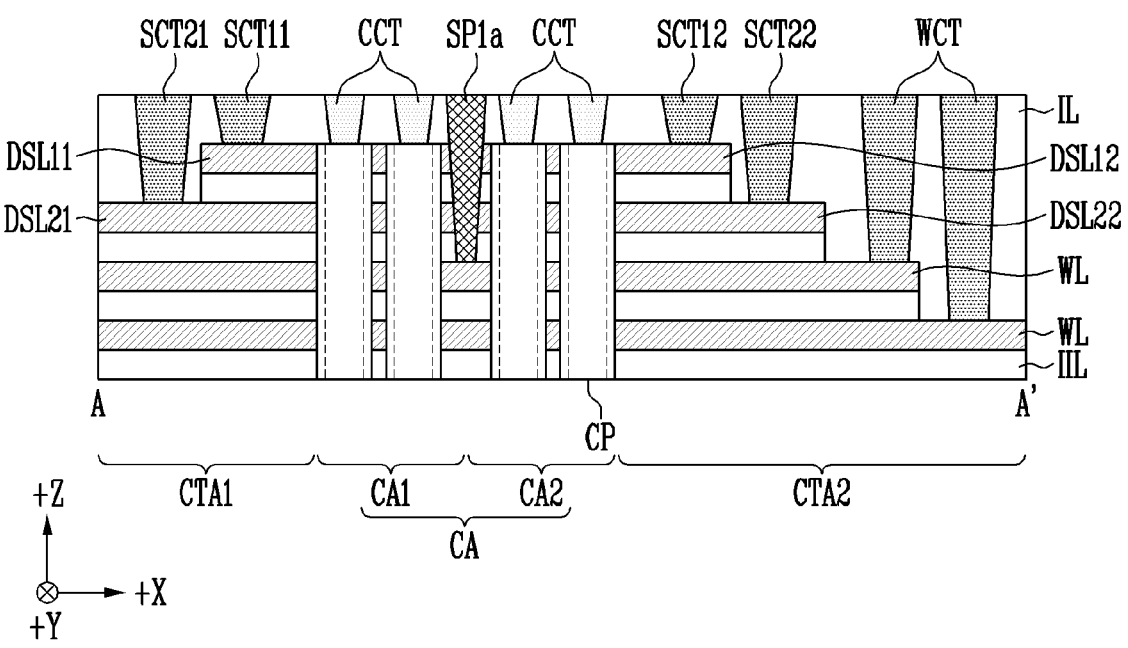
Figure 3E:
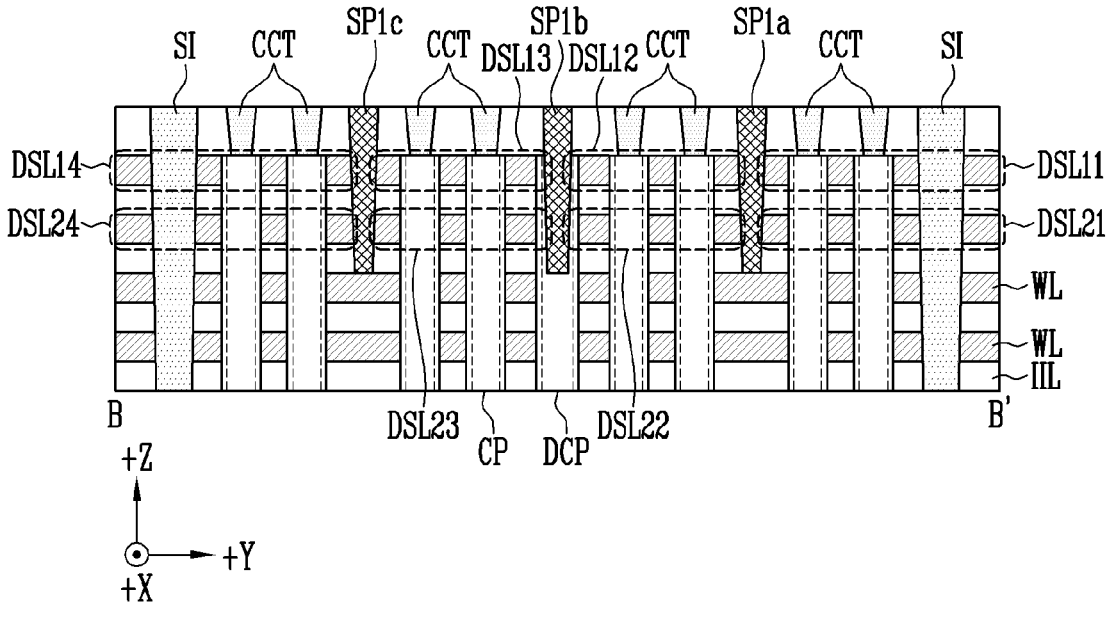

FIGS. 3A to 3E are views illustrating the structure of a memory device according to an embodiment of the present disclosure. FIG. 3A is a layout view of an i-th memory block BLKi. FIG. 3B is a perspective view illustrating the structure of the separation pattern SP of FIG. 3A. FIG. 3C is a perspective view illustrating the structure of an 11-th drain select line DSL11, a 12-th drain select line DSL12, a 21-st drain select line DSL21, and a 22-nd drain select line DSL22 of FIG. 3A. FIG. 3D is a sectional view taken along line A-A' of FIG. 3A. FIG. 3E is a sectional view taken along line B-B' of FIG. 3A.

Referring to FIG. 3A, the i-th memory block BLKi may be separated from adjacent (neighboring) memory blocks by slits SI. For example, the slits SI may be located in the positive Y (+Y) direction and the negative Y (−Y) direction from the i-th memory block BLKi, and may extend along an X axis. The i-th memory block BLKi may be adjacent to other memory blocks with the slits SI interposed therebetween.

The i-th memory block BLKi may include a cell array area CA and contact areas CTA1 and CTA2. The contact areas CTA1 and CTA2 may be disposed on both sides of the cell array area CA. For example, the first contact area CTA1 may be disposed in the −X direction from the cell array area CA, and the second contact area CTA2 may be disposed in the +X direction from the cell array area CA.

The cell array area CA may include a plurality of cell plugs CP. The cell plugs CP may be formed in a direction (e.g., +Z direction) vertical to a substrate (not illustrated). The cell plugs CP may form a plurality of rows. Each row may include cell plugs CP spaced apart from each other along the X axis. The plurality of rows may be spaced apart from each other along a Y axis. The centers of the cell plugs CP included in odd-numbered rows may be offset from the centers of the cell plugs included in even-numbered rows. For example, the cell plugs CP adjacent to each other in the +Y direction may be arranged in a zigzag shape. Although, in FIG. 3A, an embodiment in which the plurality of cell plugs CP are arranged in nine rows in the cell array area CA is illustrated, the present disclosure is not limited thereto. For example, the i-th memory block BLKi may include cell plugs CP forming eight or fewer rows or ten or more rows (e.g., 19 rows) in the cell array area CA.

Each of the cell plugs CP may include a cylindrical blocking layer BX, a charge trap layer CT formed along an inner wall of the blocking layer BX, a tunnel isolation layer TX formed along an inner wall of the charge trap layer CT, a channel layer CH formed along an inner wall of the tunnel isolation layer TX, and a core pillar CO formed in a cylindrical shape in an area enclosed by the channel layer CH. The blocking layer BX and the tunnel isolation layer TX may be formed of an oxide layer (e.g., a silicon oxide layer). The charge trap layer CT may be formed of a nitride layer. The channel layer CH may be formed of a doped silicon layer. The core pillar CO may be formed of an insulating layer or a conductive layer. The blocking layer BX, the charge trap layer CT, the tunnel isolation layer TX, the channel layer CH, and the core pillar CO, which are formed in each cell plug CP may extend in a vertical (Z) direction.

The bit lines may be disposed in the cell array area CA of the i-th memory block BLKi. For example, first to third bit lines BL1 to BL3 may be disposed in the cell array area CA. The first to third bit lines BL1 to BL3 may be disposed to be spaced apart from each other along the X axis. Further, each of the first to third bit lines BL1 to BL3 may extend along the Y axis. Each of the first to third bit lines BL1 to BL3 may be coupled to at least one cell plug CP.

Each of the first contact area CTA1 and the second contact area CTA2 may have a step structure. In the first contact area CTA1 and the second contact area CTA2, contacts may be formed. For example, select line contacts SCT may be formed in the first contact area CTA1. Furthermore, select line contacts SCT and word line contacts WCT may be formed in the second contact area CTA2. The word line contacts WCT may be coupled to the word lines WL, respectively. Also, the select line contacts SCT may be coupled to drain select lines DSL, respectively.

Referring to FIGS. 3A and 3B, the i-th memory block BLKi may include a separation pattern SP. The separation pattern SP may include first separation patterns SP1, second separation patterns SP2, and third separation patterns SP3. First separation patterns SP1a, SP1b, and SP1c may be referred to as the first separation patterns SP1. Second separation patterns SP2a, SP2b, SP2c, and SP2d may be referred to as the second separation patterns SP2. Third separation patterns SP3a and SP3b may be referred to as the third separation patterns SP3. The first to third separation patterns SP1, SP2, and SP3 may include insulating materials. The first to third separation patterns SP1, SP2, and SP3 may be integrated into a single body without being separated from each other.

Each of the first separation patterns SP1 may extend along the X axis. For example, each of the first separation patterns SP1 may extend in the-X direction (or +X direction). The cross-section of each of the first separation patterns SP1 may have a major axis in the +X direction and a minor axis in the +Y direction. The −X direction may be referred to as the negative X direction. Similarly, the −Y and −Z directions may be referred to as the negative Y and negative Z directions, respectively. A negative first direction, for example, is a direction opposite a first direction.

The lengths of the first separation patterns SP1 in the X-axis direction may be equal to each other. The lengths of the first separation patterns SP1 in the X-axis direction may correspond to the length of the cell array area CA in the X-axis direction.

The cell array area CA may be divided into a plurality of cell areas by the first separation patterns SP1. For example, the first separation pattern SP1a may be disposed between a first cell area CA1 and a second cell area CA2. The second cell area CA2 may be disposed in the −Y direction from the first cell area CA1. When three first separation patterns SP1 are included in the i-th memory block BLKi, as illustrated in FIGS. 3A and 3B, the cell array area CA may be divided into four cell areas (e.g., CA1 and CA2). When N first separation patterns SP1 are included in the i-th memory block BLKi, the cell array area CA may be divided into N+1-th cell areas. Various embodiments related to this will be described in detail later with reference to FIGS. 6 to 8.

The second separation patterns SP2 may extend from both ends of each first separation pattern SP1 in the −Y direction and the +Y direction, respectively. In an example, of both ends of the first separation pattern SP1a, at the end in the +X direction, the second separation pattern SP2a extending in the +Y direction may be disposed, and at the end in the −X direction, the second separation pattern SP2b extending in the −Y direction may be disposed. In an example, of both ends of the first separation pattern SP1*b*, at the end in the +X direction, the second separation pattern SP2*c* extending in the −Y direction may be disposed, and at the end in the −X direction, the second separation pattern SP2*b* extending in the +Y direction may be disposed. Each of the first separation patterns SP1 may be coupled to two second separation patterns SP2. Because two second separation patterns SP2 extending from any one first separation pattern SP1 are located in opposite directions (e.g., +Y direction and −Y direction), the second separation patterns SP2 (e.g., SP2*a* and SP2*c*) adjacent to each other along the Y axis may be disposed to be spaced apart from each other.

The second separation patterns SP2 may be formed at boundaries between the cell array area CA and the contact areas CTA1 and CTA2. For example, the second separation patterns SP2 (e.g., SP2*b* and SP2*d*) may be disposed between the cell array area CA and the first contact area CTA1. Alternatively, the second separation patterns SP2 (e.g., SP2*a* and SP2*c*) may be disposed between the cell array area CA and the second contact area CTA2.

Each third separation pattern SP3 may extend from any one second separation pattern SP2 in the −X direction (or +X direction). Further, each third separation pattern SP3 may be disposed in a direction opposite the first separation pattern SP1 with respect to the one second separation pattern SP2. In an example, the third separation pattern SP3*a* may extend from the second separation pattern SP2*b* in the −X direction. The third separation pattern SP3*a* may be disposed in a direction opposite the first separation pattern SP1*b* with respect to the second separation pattern SP2*b*. In an example, the third separation pattern SP3*b* may extend from the second separation pattern SP2*c* in the +X direction. The third separation pattern SP3*b* may be disposed in a direction opposite the first separation pattern SP1*b* with respect to the second separation pattern SP2*c*.

Each third separation pattern SP3 may extend from any one of both ends of the corresponding second separation pattern SP2. In an example, the third separation pattern SP3*a* may extend from the end of the second separation pattern SP2*b* disposed in the −Y direction. In an example, the third separation pattern SP3*b* may extend from the end of the second separation pattern SP2*c* disposed in the +Y direction. However, this is only an example, and the scope of the present disclosure is not limited thereto. In an embodiment, any one of both ends of each third separation pattern SP3 may contact a portion between both ends of the corresponding second separation pattern SP2. In relation to this, description will be made later with reference to FIGS. 7 and 8.

The lengths of the third separation patterns SP3 in the X-axis direction may correspond to the lengths of the drain select lines DSL, included in the contact areas CTA1 and CTA2, in the X-axis direction. The length of the third separation pattern SP3*a* in the X-axis direction may correspond to the length of the first contact area CTA1 in the X-axis direction. The length of the third separation pattern SP3*b* in the X-axis direction may be shorter than the length of the second contact area CTA2 in the X-axis direction.

Referring to FIGS. 3A and 3C, the i-th memory block BLKi may include drain select lines DSL. For example, the i-th memory block BLKi may include an 11-th drain select line DSL11, a 12-th drain select line DSL12, a 13-th drain select line DSL13, a 14-th drain select line DSL14, a 21-st drain select line DSL21, a 22-nd drain select line DSL22, a 23-rd drain select line DSL23, and a 24-th drain select line DSL24. The 11-th drain select line DSL11, the 12-th drain select line DSL12, the 13-th drain select line DSL13, and the 14-th drain select line DSL14 may be included in the uppermost conductive layer among conductive layers stacked in the i-th memory block BLKi. The 21-st drain select line DSL21, the 22-nd drain select line DSL22, the 23-rd drain select line DSL23, and the 24-th drain select line DSL24 may be included in a second conductive layer from the uppermost conductive layer among the conductive layers stacked in the i-th memory block BLKi.

Each of the drain select lines DSL may include a cell area and a contact area. For example, the 11-th drain select line DSL11 may include an 11-th cell area CA11 and an 11-th contact area CTA11. The 21-st drain select line DSL21 may include a 21-st cell area CA21 and a 21-st contact area CTA21. The 12-th drain select line DSL12 may include a 12-th cell area CA12 and a 12-th contact area CTA12. The 22-nd drain select line DSL22 may include a 22-nd cell area CA22 and a 22-nd contact area CTA22. The 11-th cell area CA11 and the 21-st cell area CA21 of FIG. 3C may be included in the first cell area CA1 of FIG. 3A. The 12-th cell area CA12 and the 22-nd cell area CA22 of FIG. 3C may be included in the second cell area CA2 of FIG. 3A. Also, the 11-th contact area CTA11 and the 21-st contact area CA21 of FIG. 3C may be included in the first contact area CTA1 of FIG. 3A. The 12-th contact area CTA12 and the 22-nd contact area CTA22 of FIG. 3C may be included in the second contact area CTA2 of FIG. 3A.

The select line contacts SCT may be coupled to respective contact areas (e.g., CTA11, CTA21, CTA12, and CTA22) of the drain select lines DSL. For example, an 11-th select line contact SCT11 may be coupled to the 11-th contact area CTA11 of the 11-th drain select line DSL11. A 21-st select line contact SCT21 may be coupled to the 21-st contact area CTA21 of the 21-st drain select line DSL21. For example, a 12-th select line contact SCT12 may be coupled to the 12-th contact area CTA12 of the 12-th drain select line DSL12. A 22-nd select line contact SCT22 may be coupled to the 22-nd contact area CTA22 of the 22-nd drain select line DSL22. The operating voltages Vop generated by the voltage generator 120 of FIG. 1 may be applied to the drain select lines DSL through the select line contacts SCT. That is, the operating voltages Vop applied through the select line contacts SCT may be transferred to the contact areas of the drain select lines DSL.

Referring to FIG. 3A, the select line contacts SCT may be adjacent to the third separation patterns SP3 along the Y axis. For example, referring to FIGS. 3A to 3C, the 11-th select line contact SCT11 may be formed in the +Y direction from the third separation pattern SP3*a*. Also, the 12-th select line contact SCT12 may be formed in the +Y direction from the third separation pattern SP3*b*. Similarly, the select line contacts SCT may also be formed in the −Y direction from the third separation patterns SP3*a* and SP3*b*.

Referring to FIG. 3A, the select line contacts SCT may be adjacent to the first separation patterns SP1 along the X axis. For example, referring to FIGS. 3A to 3C, the 11-th select line contact SCT11 may be formed in the −X direction from the first separation pattern SP1*b*. Also, the 12-th select line contact SCT12 may be formed in the +X direction from the first separation pattern SP1*b*. However, this is only an example, and the centers of the select line contacts SCT in the Y-axis direction may be offset from the centers of the first separation patterns SP1 in the Y-axis direction. In relation to this, description will be made later with reference to FIGS. 7 and 8.

The separation pattern SP may be formed with the depth (e.g., the length in the Z-axis direction) at which the drain select lines DSL are separated. For example, the separation pattern SP may be formed at the depth at which the separation pattern SP can penetrate the first and second conductive layers from the uppermost conductive layer, among the conductive layers stacked in the i-th memory block BLKi. Therefore, by the separation pattern SP, the drain select lines DSL may be separated from each other, and the word lines WL may not be separated.

For example, the first separation patterns SP1 may separate the cell areas included in the drain select lines DSL. Referring to FIGS. 3B and 3C, the first separation pattern SP1a may separate the 11-th cell area CA11 from the 12-th cell area CA12, and may separate the 21-st cell area CA21 from the 22-nd cell area CA22.

Furthermore, the second separation patterns SP2 may separate the cell area included in each of the drain select lines DSL from the contact areas included in other drain select lines DSL. Referring to FIGS. 3A to 3C, the second separation pattern SP2a may separate the 11-th cell area CA11 from the 12-th contact area CTA12, and may separate the 21-st cell area CA21 from the 22-nd contact area CTA22. Furthermore, the second separation pattern SP2b may separate the 12-th cell area CA12 from the 11-th contact area CTA11, and may separate the 22-nd cell area CA22 from the 21-st contact area CTA21.

The third separation patterns SP3 may separate contact areas adjacent to each other along the Y axis from each other among the contact areas included in the drain select lines DSL. Referring to FIGS. 3A and 3B, the third separation pattern SP3a may separate the contact area (e.g., the 11-th contact area CTA11 of FIG. 3C) of the 11-th drain select line DSL11 from the contact area of the 13-th drain select line DSL13. Further, the third separation pattern SP3b may separate the contact area (e.g., the 12-th contact area CTA12 of FIG. 3C) of the 12-th drain select line DSL12 from the contact area of the 14-th drain select line DSL14.

Therefore, the 11-th drain select line DSL11 and the 13-th drain select line DSL13 may be separated from each other by the third separation pattern SP3a. Further, the 12-th drain select line DSL12 and the 14-th drain select line DSL14 may be separated from each other by the third separation pattern SP3b. Similarly, the 21-st drain select line DSL21 and the 23-rd drain select line DSL23 may be separated from each other by the third separation pattern SP3a, and the 22-nd drain select line DSL22 and the 24-th drain select line DSL24 may be separated from each other by the third separation pattern SP3b.

Referring to FIG. 3A and 3B, the 11-th drain select line DSL11 and the 12-th drain select line DSL12 may be separated from each other by the first separation pattern SP1a and the second separation patterns SP2a and SP2b. Further, the 13-th drain select line DSL13 and the 14-th drain select line DSL14 may be separated from each other by the first separation pattern SP1c and the second separation patterns SP2c and SP2d. Similarly, the 21-st drain select line DSL21 and the 22-nd drain select line DSL22 may be separated from each other by the first separation pattern SP1a and the second separation patterns SP2a and SP2b. Further, the 23-rd drain select line DSL23 and the 24-th drain select line DSL24 may be separated from each other by the first separation pattern SP1c and the second separation patterns SP2c and SP2d.

Further, the 12-th drain select line DSL12 and the 13-th drain select line DSL13 may be separated from each other by the first separation pattern SP1b. Similarly, the 22-nd drain select line DSL22 and the 23-rd drain select line DSL23 may be separated from each other by the first separation pattern SP1b. However, this is only an example, and the 12-th drain select line DSL12 and the 13-th drain select line DSL13 may be separated from each other by the first separation patterns SP1 and the second separation patterns SP2. In relation to this, description will be made later with reference to FIGS. 7 and 8.

Referring to FIG. 3C, the widths of a cell area and a contact area, which are included in each of the drain select lines DSL, in the Y-axis direction may be different from each other. The width of the contact area included in any one drain select line DSL in the Y-axis direction may be greater than the width of the cell area in the Y-axis direction. For example, the first width W1 of the 11-th cell area CA11 in the Y-axis direction may be smaller than the second width W2 of the 11-th contact area CTA11 in the Y-axis direction. Further, the second width W2 of the 11-th contact area CTA11 in the Y-axis direction may be greater than a value obtained by adding the first width W1 of the 11-th cell area CA11 in the Y-axis direction to the 1'-th width W1' of the 12-th cell area CA12 in the Y-axis direction. For example, the second width W2 may correspond to a value obtained by summing the first width W1, the 1'-th width W1', and the width of the corresponding first separation pattern SP1 in the Y-axis direction. Therefore, the second width W2 may be at least twice the first width W1.

Because the second width W2 of the contact area (e.g., CTA11) is greater than the first width W1 of the cell area (e.g., CA11), a margin for forming the select line contacts (e.g., SCT11) in the contact area (e.g., CTA11) may be secured compared to the case where the width of the contact area is equal to the width of the cell area. Therefore, when the select line contacts (e.g., SCT11) are formed in the contact area (e.g., CTA11), defects in the process may be decreased, and difficulty in a manufacturing process may be reduced.

In order to form the second width W2 of the contact area (e.g., CTA11) to be greater than the first width W1 of the cell area (e.g., CA11), contact areas (e.g., CTA11 and CTA12) may be formed on both sides of the cell areas (e.g., CA11 and CA12). For example, when the 11-th drain select line DSL11 and the 12-th drain select line DSL12 are compared to each other, directions in which the contact areas CTA11 and CTA12 are located may be opposite each other with respect to the cell areas CA11 and CA12. The 11-th contact area CTA11 may extend from the 11-th cell area CA11 in the −X direction, and the 12-th contact area CTA12 may extend from the 12-th cell area CA12 in the +X direction. That is, the 11-th contact area CTA11 may be located adjacent to the 11-th cell area CA11 and the 12-th cell area CA12 in the −X direction, and the 12-th contact area CTA12 may be located adjacent to the 11-th cell area CA11 and the 12-th cell area CA12 in the +X direction.

Referring to FIG. 3D, the i-th memory block BLKi may include conductive layers stacked along a Z axis and interlayer insulating layers IIL formed between the conductive layers. The conductive layers may include drain select lines DSL, word lines WL, and source select lines SSL. In FIG. 3D, it will be understood that only some of the stacked conductive layers are illustrated.

The i-th memory block BLKi may include a cell array area CA and contact areas CTA1 and CTA2 on both sides of the cell array area CA.

In the cell array area CA, cell plugs CP penetrating the conductive layers and the interlayer insulating layers IIL in the Z-axis direction may be formed. On the cell plugs CP, cell contacts CCT may be formed. The cell plugs CP may be coupled to the bit lines BL of FIG. 3A through the cell contacts CCT.

The cell array area CA may include a first cell area CA1 and a second cell area CA2. The first separation pattern SP1a may be formed between the first cell area CA1 and the second cell area CA2. The first separation pattern SP1a may be formed at the depth at which the drain select lines DSL are separated. For example, by the first separation pattern SP1a, the 11-th drain select line DSL11 and the 12-th drain select line DSL12 may be separated from each other, and the 21-st drain select line DSL21 and the 22-nd drain select line DSL22 may be separated from each other. However, by the first separation pattern SP1a, the word lines WL may not be separated from each other.

The contact areas CTA1 and CTA2 may have step structures formed on both sides of the cell array area CA. The first contact area CTA1 may have a step structure extending from the cell array area CA in the −X direction. For example, the first contact area CTA1 may include pads through which the 11-th drain select line DSL11 and the 21-st drain select line DSL21 are exposed, respectively. Further, the second contact area CTA2 may have a step structure extending from the cell array area CA in the +X direction. For example, the second contact area CTA2 may include pads through which the 12-th drain select line DSL12 and the 22-nd drain select line DSL22 are exposed, respectively. Although the first contact area CTA1 includes only the pads of the drain select lines DSL, the second contact area CTA2 may include pads of the drain select lines DSL, word lines WL, and source select lines SSL, which are omitted in FIG. 3D. Therefore, the length of the second contact area CTA2 in the X-axis direction may be greater than the length of the first contact area CTA1 in the X-axis direction.

Select line contacts SCT11 and SCT21 may be formed in the first contact area CTA1. The 11-th select line contact SCT11 may be coupled to the 11-th drain select line DSL11, and the 21-st select line contact SCT21 may be coupled to the 21-st drain select line DSL21. In the second contact area CTA2, select line contacts SCT12 and SCT22 and word line contacts WCT may be formed. The 12-th select line contact SCT12 may be coupled to the 12-th drain select line DSL12, the 22-nd select line contact SCT22 may be coupled to the 22-nd drain select line DSL22, and respective word line contacts WCT may be coupled to the word lines WL. The drain select lines DSL may receive operating voltages Vop through the select line contacts SCT11, SCT21, SCT12, and SCT22. Furthermore, the word lines WL may receive the operating voltages Vop through the word line contacts WCT.

Referring to FIG. 3E, the i-th memory block BLKi may include drain select lines DSL, word lines WL, and interlayer insulating layers IIL. The word lines WL may be separated from the word lines of adjacent memory blocks by slits SI. The drain select lines DSL may be separated from each other by at least first separation patterns SP1. For example, the first separation pattern SP1a may be formed between the 11-th drain select line DSL11 and the 12-th drain select line DSL12. The first separation pattern SP1b may be formed between the 12-th drain select line DSL12 and the 13-th drain select line DSL13. The first separation pattern SP1c may be formed between the 13-th drain select line DSL13 and the 14-th drain select line DSL14. Similarly, the first separation pattern SP1a may be formed between the 21-st drain select line DSL21 and the 22-nd drain select line DSL22. The first separation pattern SP1b may be formed between the 22-nd drain select line DSL22 and the 23-rd drain select line DSL23. The first separation pattern SP1c may be formed between the 23-rd drain select line DSL23 and the 24-th drain select line DSL24.

Referring to FIGS. 3A and 3E, some of the first separation patterns (e.g., SP1a and SP1c) may be formed between the cell plugs. Further, others (e.g., SP1b) of the first separation patterns may be formed to overlap the cell plugs CP. The cell plugs overlapping the first separation pattern SP1b may be dummy cell plugs DCP. Unlike the cell plugs CP, the dummy cell plugs DCP may not function as select transistors or memory cell transistors.

Although, in FIGS. 3A to 3E, the description has been made on the assumption that the i-th memory block BLKi includes two layers of drain select lines DSL, the present disclosure is not limited thereto. For example, when the i-th memory block BLKi includes one layer of a drain select line DSL, the separation pattern SP may be formed at the depth at which the separation pattern SP is capable of penetrating the one layer of the drain select line DSL, and some of the drain select lines (e.g., DSL21, DSL22, DSL23, and DSL24) and some of select line contacts (e.g., SCT21, SCT22, etc.) may be omitted.

FIGS. 4A to 4F are views illustrating a method of manufacturing a memory device according to an embodiment of the present disclosure. FIGS. 4A to 4F are sectional views taken along line A-A' of FIG. 3A.

Figure 4A:
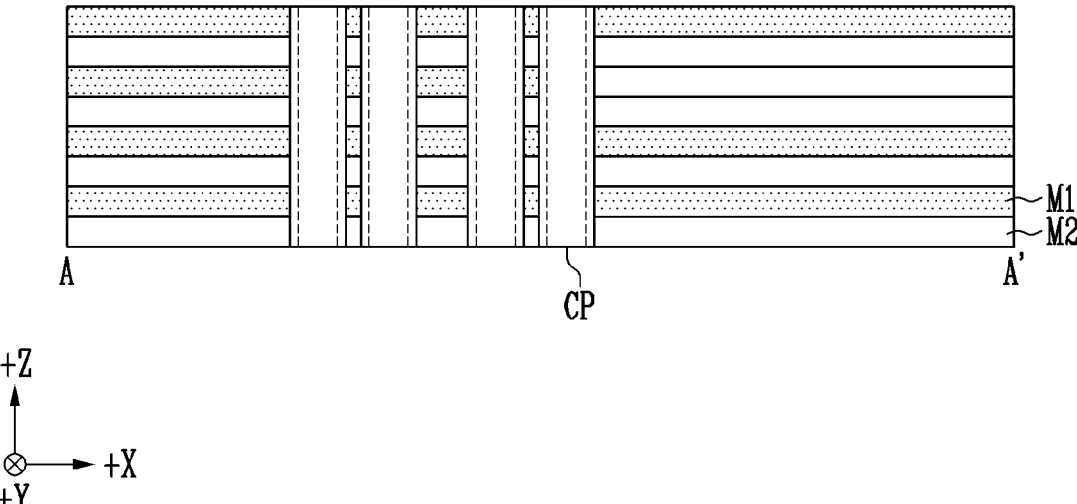
FIGS. 4A to 4F are views illustrating a method of manufacturing a memory device according to an embodiment of the present disclosure.

Referring to FIG. 4A, a stacked body in which first material layers M1 and second material layers M2 are alternately stacked may be formed. The first material layers M1 may be formed of a material that can be selectively removed in a subsequent process. Therefore, the first material layers M1 may be formed of a material having etch selectivity different from that of the second material layers M2. For example, each of the first material layers M1 may be formed of a nitride layer. The second material layers M2 may be formed of an insulating material. For example, each of the second material layers M2 may be formed of an oxide layer (e.g., a silicon oxide layer).

Cell plugs CP may be formed in portions of the stacked body. The cell plugs CP may be formed to penetrate the stacked body in a Z-axis direction.

Figure 4B:
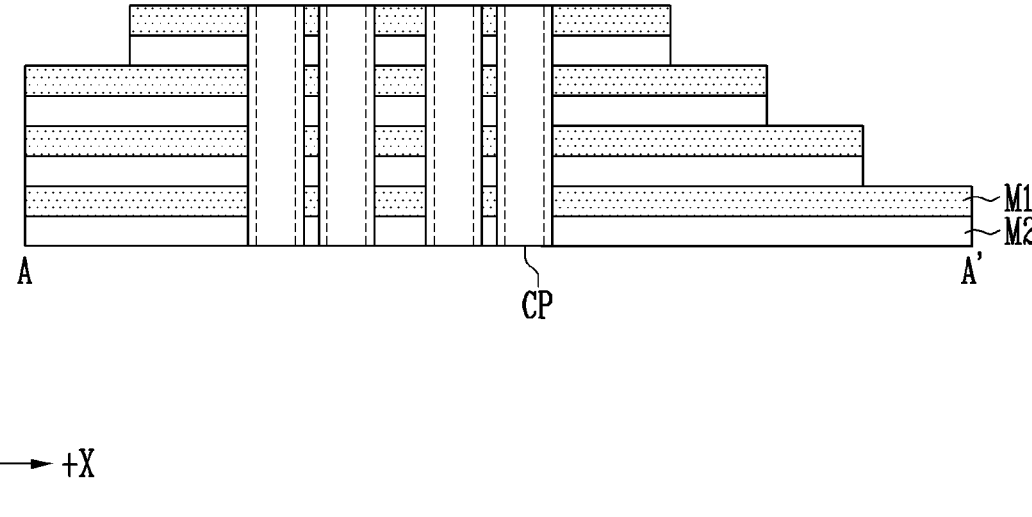

Referring to FIG. 4B, a portion of the stacked body may be etched to form step structures. For example, portions of the first material layers M1 and the second material layers M2 may be etched such that the first material layers M1 are respectively exposed.

Figure 4C:
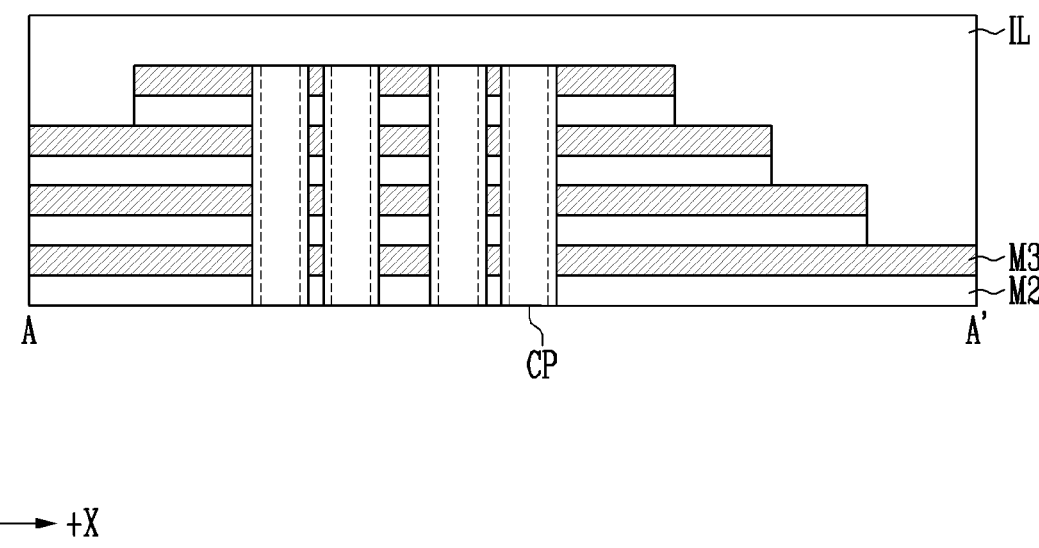

Referring to FIG. 4C, an insulating layer IL covering the stacked body including the step structures may be formed. The insulating layer IL may be an oxide layer.

Slit trenches (not illustrated) passing through the stacked body and the insulating layer IL and extending in an X-axis direction may be formed. An etching process for removing the first material layers M1 exposed through the slit trenches may be performed. The etching process may be a wet etching process of leaving the second material layers M2 and selectively removing the first material layers M1.

Spaces between the second material layers M2, from which the first material layers M1 are removed, may be filled with third material layers M3. The third material layers M3 may be conductive layers. For example, each of the third material layers M3 may be formed of at least one of tungsten (W), cobalt (Co), nickel (Ni), molybdenum (Mo), silicon (Si), and polysilicon (Poly-Si). The third material layers M3 may be used as gate lines, for example, drain select lines DSL, word lines WL, or source select lines SSL.

Although not illustrated in the drawings, the slit trenches may be filled with slit insulating layers after the spaces between the second material layers M2 are filled with the third material layers M3.

Figure 4D:
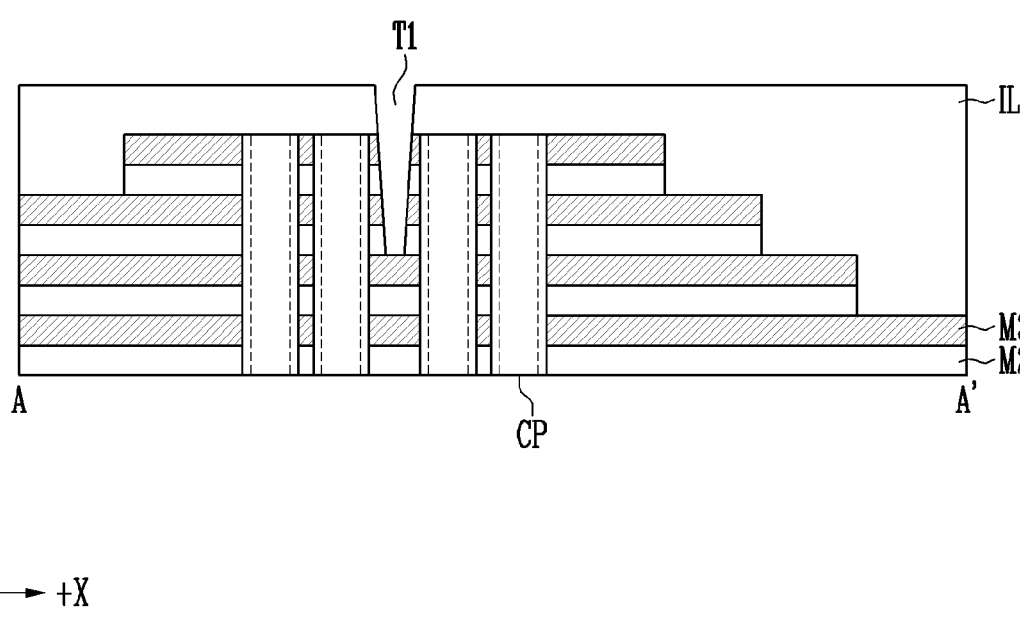

Referring to FIG. 4D, a trench (e.g., a first trench T1) passing through a portion of the stacked body may be formed. For example, a trench (e.g., a first trench T1) passing through the insulating layer IL and the one or more third material layers M3 may be formed. In order to form trenches at designated locations, an anisotropic dry etching process may be performed.

The trench may include first to third trenches respectively corresponding to the first to third separation patterns SP1 to SP3 illustrated in FIGS. 3A and 3B. For example, the first trench T1 may extend along the X-axis between the first cell area CA1 and the second cell area CA2. Also, the second trenches (not illustrated) may extend from both ends of the first trench T1 in a +Y direction and a −Y direction, respectively. The third trench (not illustrated) may extend from any one second trench in the −X direction (or +X direction), and may be located in a direction opposite the first trench T1 with respect to the corresponding second trench.

The description of the position relationships between the first to third separation patterns SP1 to SP3 described above in relation to FIGS. 3A to 3C may be applied to position relationships between the first to third trenches. For example, a first conductive layer included in the stacked body (e.g., a third material layer M3 located at a first or second position from the uppermost material layer among the third material layers M3) may be separated into two or more drain select lines DSL by the first to third trenches. Referring to FIG. 3A together with FIG. 4D, the first conductive layer may be separated into 11-th to 14-th drain select lines DSL11 to DSL14 by the first to third trenches.

Further, the first to third trenches may be coupled to each other. For example, as in the case of the first to third separation patterns SP1 to SP3 illustrated in FIG. 3B, the second trenches may extend from the first trench T1, and the third trench may extend from the corresponding second trench.

The first to third trenches may be simultaneously formed through an etching process. For example, the first to third trenches may be simultaneously formed rather than some of the first to third trenches being formed first and others thereof being formed later.

Although not illustrated in the drawings, in an embodiment, some of first trenches T1 may be formed between the cell plugs CP, and others thereof may be formed to overlap some of the cell plugs CP. In this case, the cell plugs CP overlapping the first trenches T1 may be referred to as "dummy cell plugs DCP." Even in the case where each first trench T1 is formed at the position overlapping the cell plugs CP, an additional process may not be required compared to a process of forming the first trenches T1 by performing etching so that the first trenches T1 pass through the insulating layer IL and one or more third material layers M3. In other embodiments, the first trenches T1 may be formed not to overlap the cell plugs CP, and thus the dummy cell plugs DCP may not be formed.

Figure 4E:
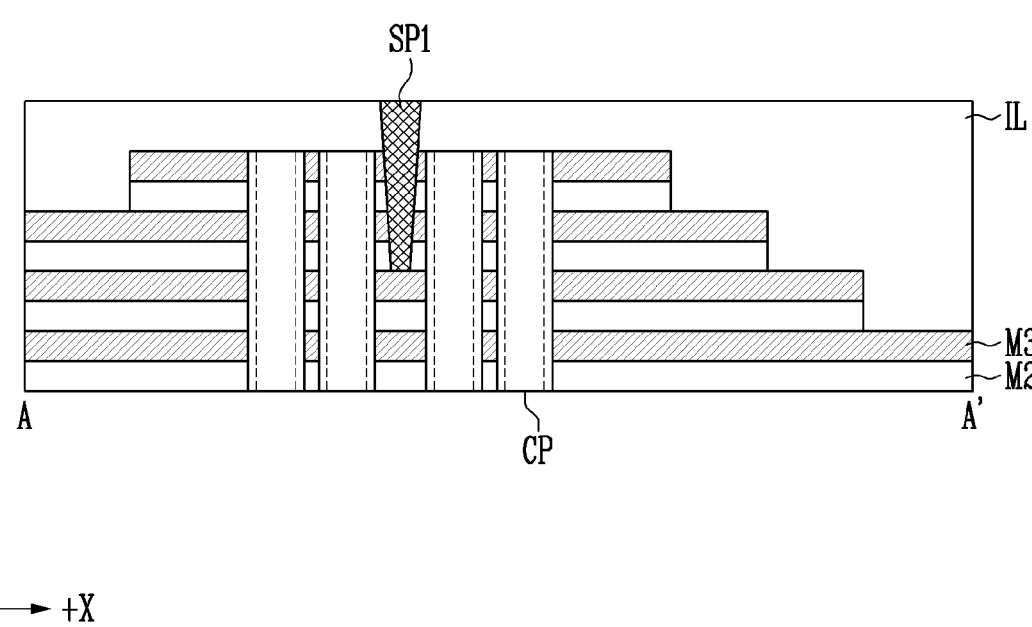

Referring to FIG. 4E, an insulating material may be formed in the first to third trenches. For example, the first trench T1 is filled with the insulating material, whereby the first separation patterns SP1 may be formed. Further, the second trenches may be filled with the insulating layer, whereby the second separation patterns may be formed, and the third trench may be filled with the insulating material, whereby the third separation pattern may be formed.

Figure 4F:
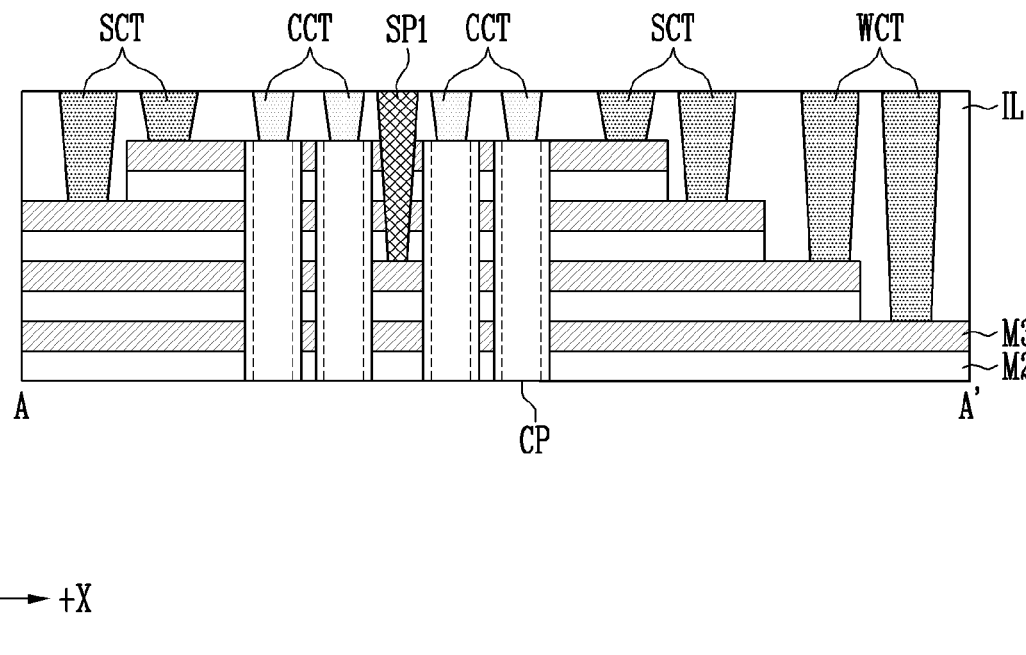

Referring to FIG. 4F, portions of the third material layers M3 may be exposed through an etching process of etching a portion of the insulating layer IL. As the etching process of removing the portion of the insulating layer IL, an anisotropic dry etching process may be performed. Further, select line contacts SCT and word line contacts WCT that contact the exposed third material layers M3 may be formed. For example, the select line contacts SCT may be formed in the-X direction from the cell plugs CP and the select line contacts SCT, the word line contacts WCT, and source line contacts (not illustrated) may be formed in the +X direction from the cell plugs CP.

Figure 5:
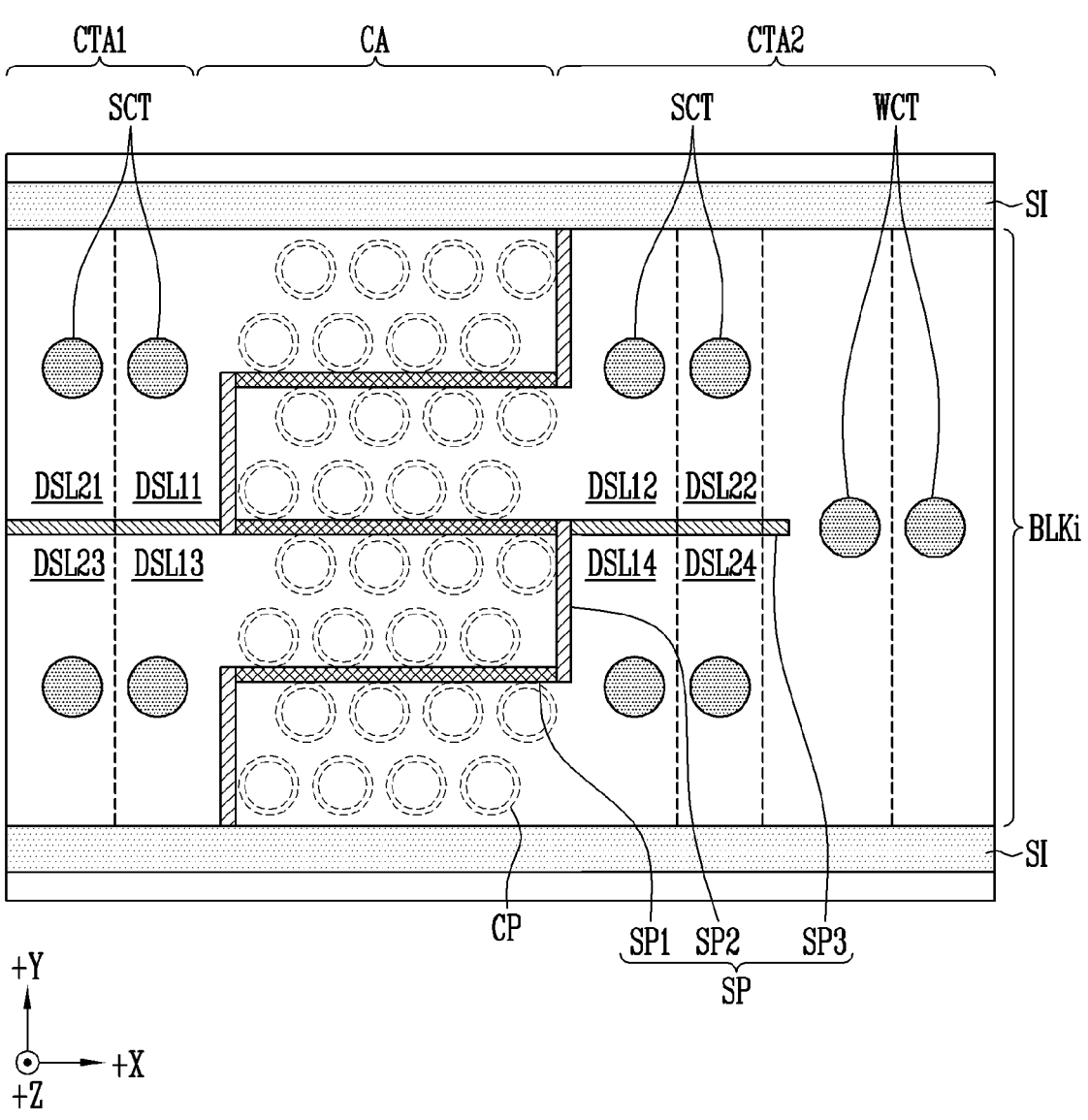
FIG. 5 is a view illustrating the structure of a memory device according to an embodiment of the present disclosure.

FIG. 5 is a view illustrating the structure of a memory device according to an embodiment of the present disclosure. A repeated description of components identical to those of FIG. 3A, among the components illustrated in FIG. 5, will be omitted, or will be simply made.

Referring to FIG. 5, first separation patterns SP1 may be formed not to overlap cell plugs CP. For example, the first separation patterns SP1 may be formed between respective rows of the cell plugs CP. When the first separation patterns SP1 are formed not to overlap the cell plugs CP, the memory device may not include the dummy cell plugs DCP illustrated in FIG. 3E. When the first separation patterns SP1 are formed between the cell plugs CP, the cell plugs CP included in the cell array area CA of the i-th memory block BLKi may function as select transistors or memory cell transistors. Referring to FIGS. 3A and 5, the separation pattern SP overlaps the cell plugs CP, and thus this configuration may fall within the scope of the present disclosure as long as the features of the separation pattern SP described in the present disclosure are satisfied regardless of whether the dummy cell plugs DCP are formed.

Figure 6:
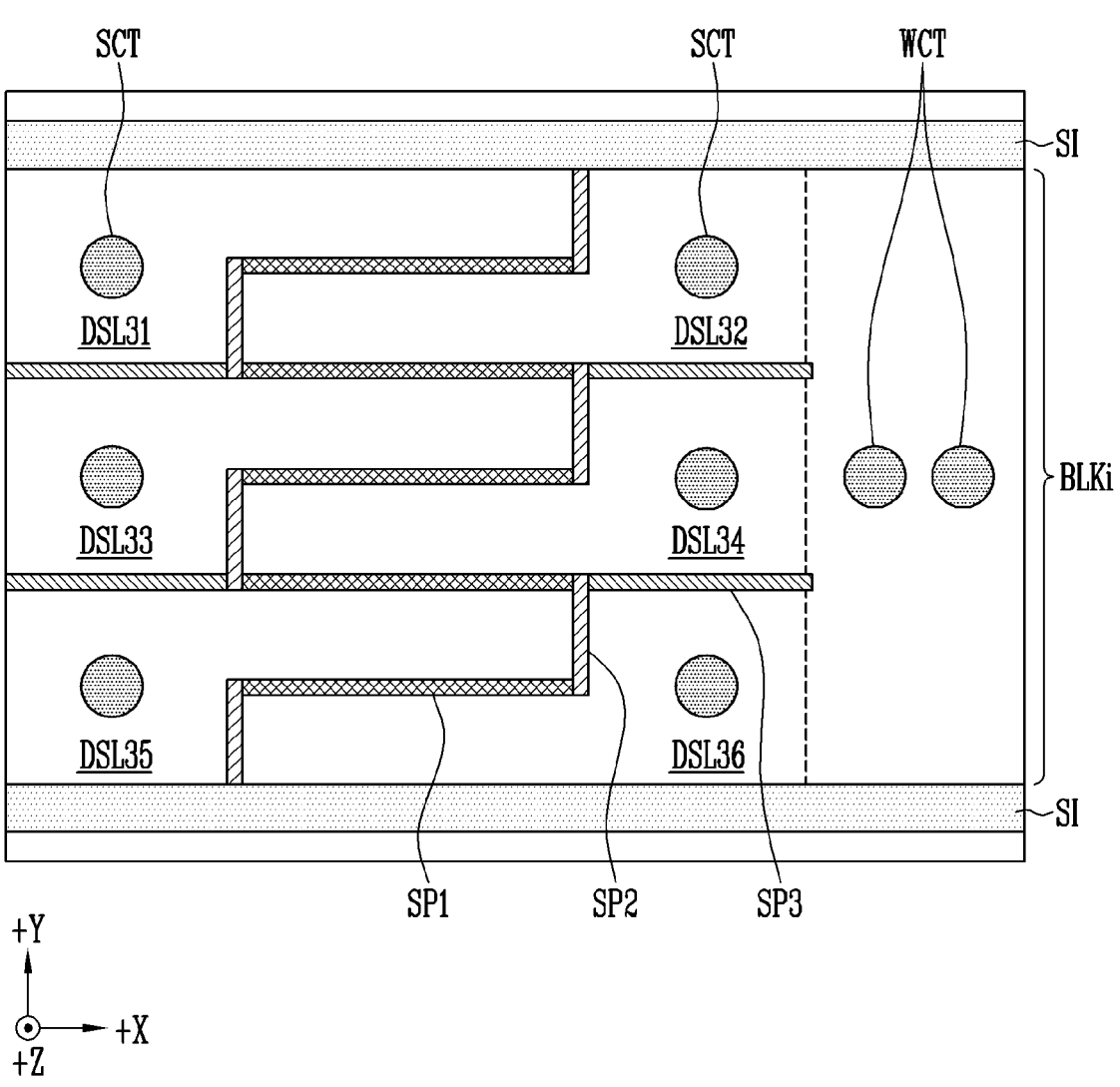
FIGS. 6 to 8 are views illustrating the structure of a memory device according to various embodiments of the present disclosure.
Figure 7:
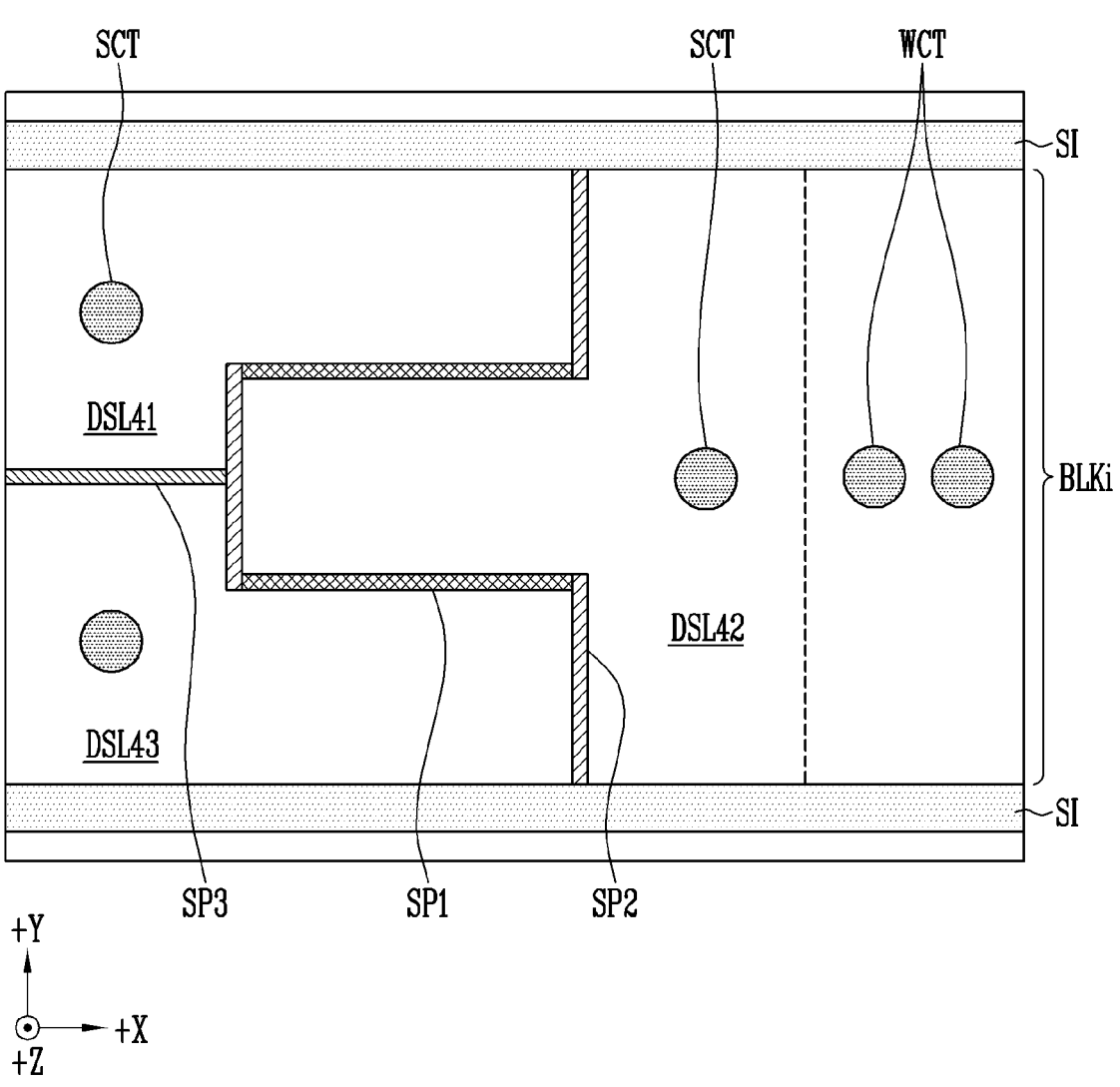
Figure 8:
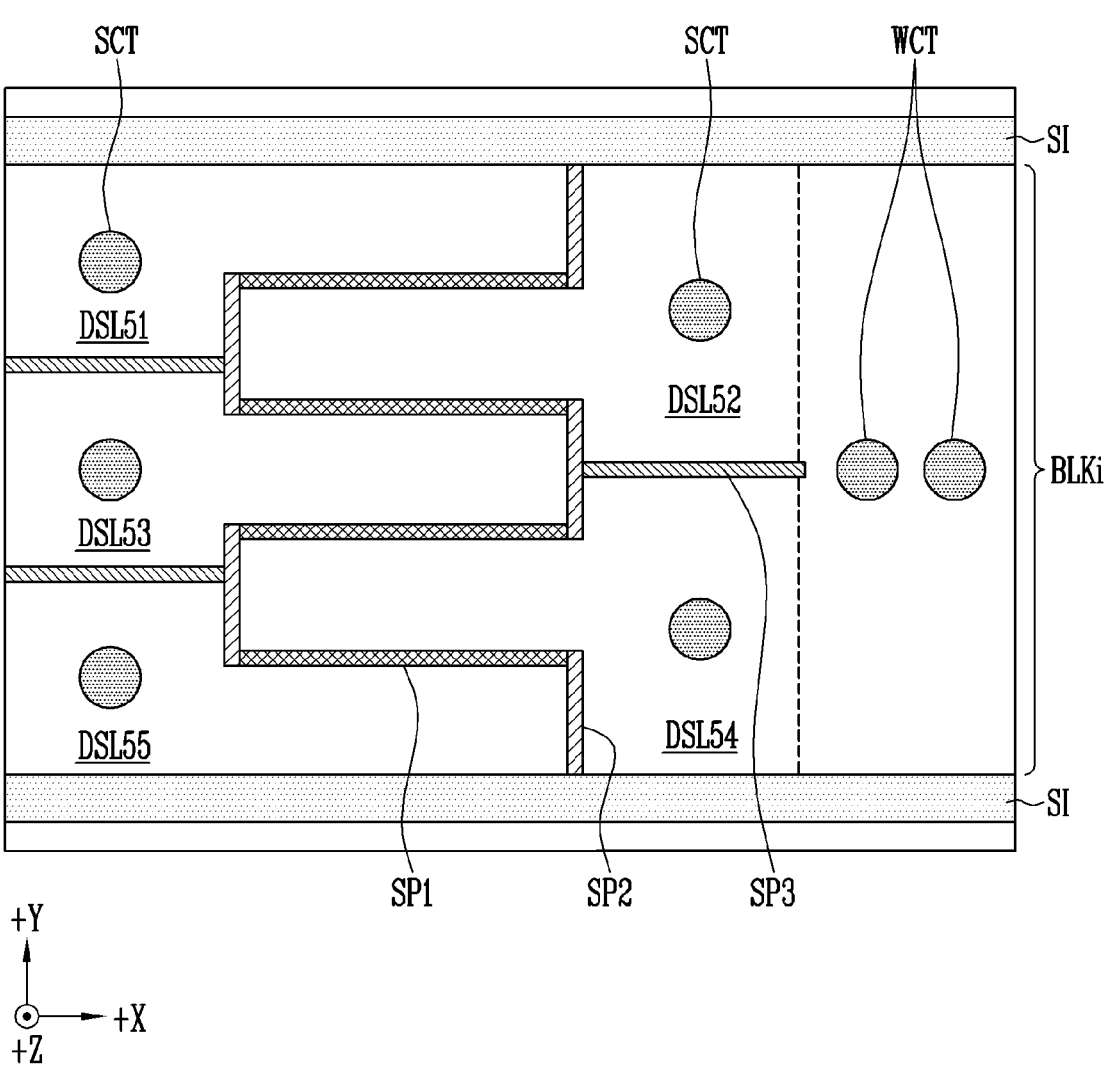

FIGS. 6 to 8 are views illustrating the structure of a memory device according to various embodiments of the present disclosure. FIGS. 6 to 8 are layout views of an i-th memory block BLKi according to various embodiments of the present disclosure. In FIGS. 6 to 8, illustration of cell plugs CP or bit lines BL is omitted, and the number or shape of separation patterns SP will be mainly described. For example, as long as the features of the separation pattern SP described in relation to FIGS. 6 to 8 are satisfied, the structure may fall within the scope of the present disclosure even though the numbers or arrangement shapes of cell plugs CP included in the cell array area CA of the i-th memory block BLKi are different from each other. Furthermore, although description has been made on the assumption that each drain select line DSL is formed of one layer, various embodiments illustrated in FIGS. 6 to 8 may also be applied to the case where the drain select line DSL is formed of two layers.

Referring to FIG. 6, the i-th memory block BLKi may include five first separation patterns SP1. The cell array area CA may be divided into six cell areas by the five first separation patterns SP1. Second separation patterns SP2 may be located in any one of the +X direction and the −X direction from the cell areas. The second separation patterns SP2 may be formed to correspond to the number of cell areas. The cell areas included in 31-st, 33-rd, and 35-th drain select lines DSL31, DSL33, and DSL35 may contact the second separation patterns SP2 located in the +X direction, and the cell areas included in 32-nd, 34-th, and 36-th drain select lines DSL32, DSL34, and DSL36 may contact the second separation patterns SP2 located in the −X direction. The third separation patterns SP3 may extend from some of the second separation patterns SP2 in the +X direction or the −X direction. Each of the third separation patterns SP3 may extend from any one of both ends of any one second separation pattern SP2. For example, the third separation patterns SP3 may be formed at positions on the Y axis identical to those of even-numbered first separation patterns SP1 from the uppermost first separation pattern SP1 located in the +Y direction among the first separation patterns SP1.

Referring to FIG. 7, the i-th memory block BLKi may include two first separation patterns SP1. The cell array area CA may be divided into three cell areas by the two first separation patterns SP1. Second separation patterns SP2 may be located in any one of the +X direction and the −X direction from the cell areas. One second separation pattern SP2 may be formed at the boundary between the cell array area CA and the first contact area CTA1, and two second separation patterns SP2 may be formed at the boundary between the cell array area CA and the second contact area CTA2. Any one of both ends of a third separation pattern SP3 may contact a portion between both ends of the corresponding second separation pattern SP2. For example, the third separation pattern SP3 may extend from the center of the corresponding second separation pattern SP2 in the −X direction. Further, a 41-st drain select line DSL41 and a 42-nd drain select line DSL42 may be separated from each other by the first separation patterns SP1 and the second separation patterns SP2. Therefore, the 41-st drain select line DSL41 and a 43-rd drain select line DSL43 may be separated from each other by the third separation pattern SP3.

Referring to FIG. 8, the i-th memory block BLKi may include four first separation patterns SP1. The cell array area CA may be divided into five cell areas by the four first separation patterns SP1. Second separation patterns SP2 may be located in any one of the +X direction and the −X direction from the cell areas. Two second separation pattern SP2 may be formed at the boundary between the cell array area CA and the first contact area CTA1, and three second separation patterns SP2 may be formed at the boundary between the cell array area CA and the second contact area CTA2. Any one of both ends of each third separation pattern SP3 may contact a portion between both ends of the corresponding second separation pattern SP2. For example, each of the third separation patterns SP3 may extend from a position, spaced apart from the central position or center of the second separation pattern SP2 by a predetermined distance, in the −X direction or +X direction. Further, a 51-st drain select line DSL51 and a 52-nd drain select line DSL52 may be separated from each other by the first separation patterns SP1 and the second separation patterns SP2. Therefore, the 51-st drain select line DSL51 and a 53-rd drain select line DSL53 may be separated from each other by the corresponding third separation pattern SP3.

Referring to FIGS. 7 and 8, when the i-th memory block BLKi is formed to include an odd number of cell areas, the sizes of drain select lines DSL may vary. For example, in FIG. 7, the width of the contact area, included in the 42-nd drain select line DSL42, in the Y-axis direction may be greater than the width of the contact area, included in the 41-st drain select line DSL41, in the Y-axis direction. Further, in FIG. 8, the width of the contact area, included in the 52-nd drain select line DSL52, in the Y-axis direction may be greater than the width of the contact area, included in the 51-st drain select line DSL51, in the Y-axis direction.

Referring to FIGS. 6 to 8, the positions of the select line contacts SCT in the Y-axis direction may be variously formed. Referring to FIG. 6, the select line contacts SCT may be adjacent to the first separation patterns SP1 along the X axis. In an example, in FIG. 7, the center of the select line contact SCT, located in the +X direction, in the Y-axis direction may match the center of the third separation pattern SP3 in the Y-axis direction. In an example, in FIGS. 7 and 8, the center of the select line contacts SCT in the Y-axis direction may be offset from the center of the first separation patterns SP1 or the third separation pattern SP3 in the Y-axis direction. However, the present disclosure is not limited thereto, and the select line contacts SCT may be formed at arbitrary positions in a contact area having a certain width. According to the present disclosure, the width of the contact area included in each drain select line DSL is formed to be greater than that of the cell area, and thus space sufficient to form the select line contacts SCT may be secured. Therefore, the difficulty in a process of forming the select line contacts SCT may be reduced compared to existing schemes.

Figure 9:
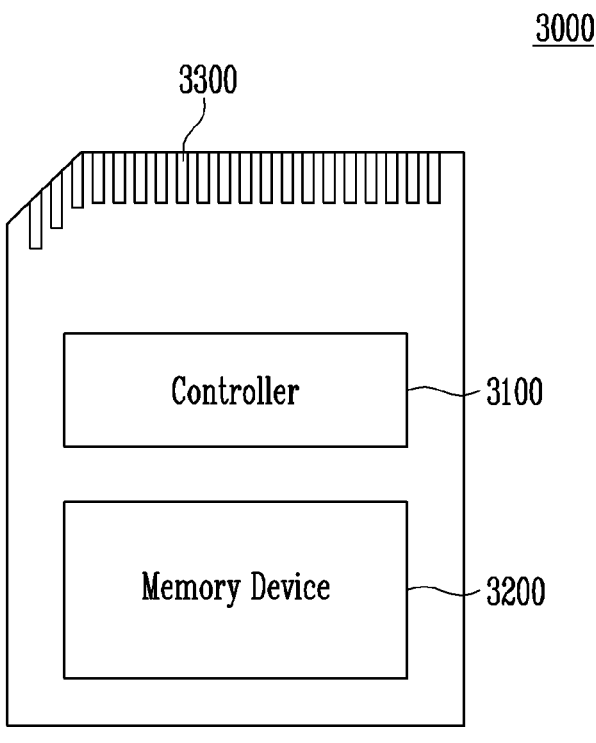
FIG. 9 is a diagram illustrating a memory card system to which a memory device according to an embodiment of the present disclosure is applied.

FIG. 9 is a diagram illustrating a memory card system to which a memory device according to an embodiment of the present disclosure is applied.

Referring to FIG. 9, a memory card system 3000 may include a controller 3100, a memory device 3200, and a connector 3300.

The controller 3100 may be coupled to the memory device 3200. The controller 3100 may access the memory device 3200. For example, the controller 3100 may control a program operation, a read operation, or an erase operation of the memory device 3200, or may control a background operation of the memory device 3200. The controller 3100 may provide an interface between the memory device 3200 and a host. The controller 3100 may run firmware for controlling the memory device 3200. In an example, the controller 3100 may include components, such as random-access memory (RAM), a processor, a host interface, a memory interface, and an error corrector.

The controller 3100 may communicate with an external device through the connector 3300. The controller 3100 may communicate with an external device (e.g., a host) based on a specific communication standard. In an embodiment, the controller 3100 may communicate with the external device through at least one of various communication standards such as universal serial bus (USB), multimedia card (MMC), embedded MMC (eMMC), peripheral component interconnection (PCI), PCI-express (PCI-E), advanced technology attachment (ATA) protocol, serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe). In an embodiment, the connector 3300 may be defined by at least one of the above-described various communication standards.

The memory device 3200 may include a plurality of memory cells, and may be configured in the same manner as the memory device 100 illustrated in FIG. 1.

The controller 3100 and the memory device 3200 may be integrated into a single semiconductor device to form a memory card. For example, the controller 3100 and the memory device 3200 may be integrated into a single semiconductor device, and may then form a memory card such as a personal computer memory card international association (PCMCIA) card, a compact flash card (CF), a smart media card (SM or SMC), a memory stick, a multimedia card (MMC, RS-MMC, MMCmicro or eMMC), an SD card (SD, miniSD, microSD, or SDHC), or a universal flash storage (UFS).

Figure 10:
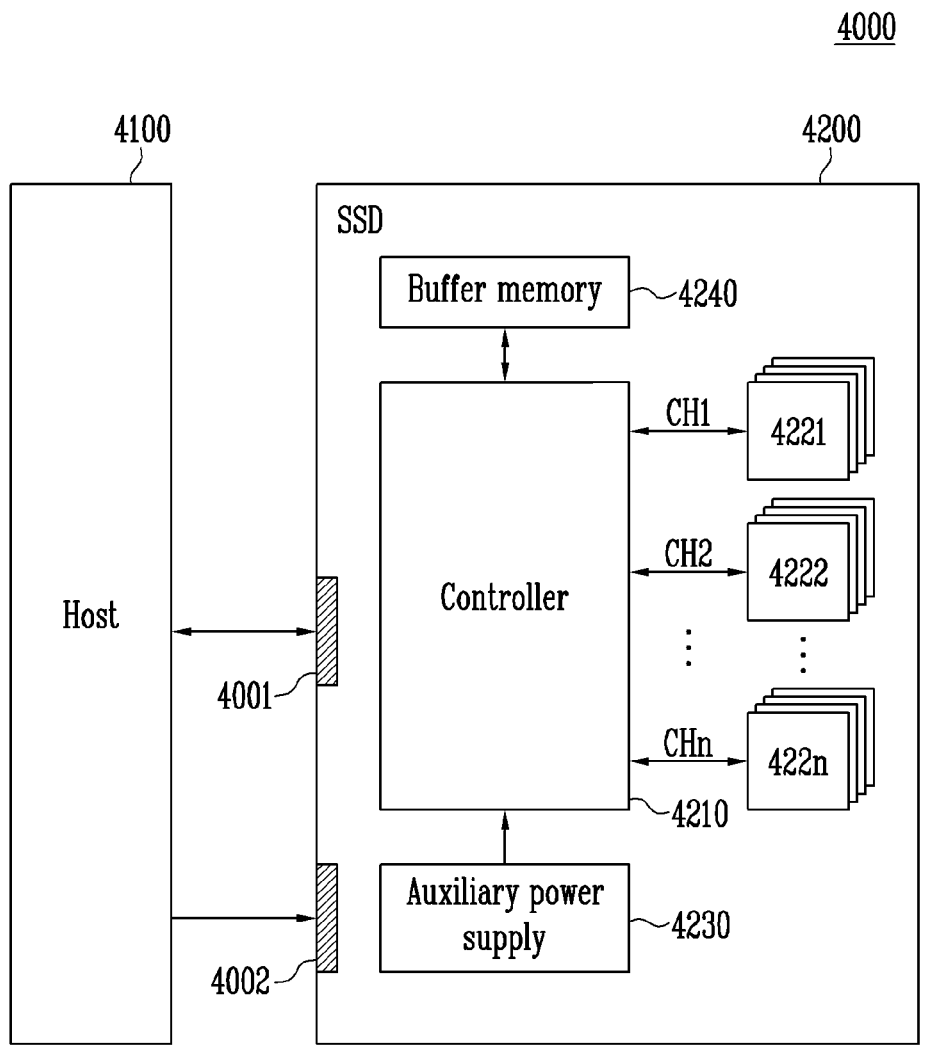
FIG. 10 is a diagram illustrating a solid-state drive (SSD) system to which a memory device according to the present disclosure is applied.

FIG. 10 is a diagram illustrating a solid-state drive (SSD) system to which a memory device according to the present disclosure is applied.

Referring to FIG. 10, an SSD system 4000 may include a host 4100 and an SSD 4200. The SSD 4200 may exchange signals with the host 4100 through a signal connector 4001, and may receive power through a power connector 4002. The SSD 4200 may include a controller 4210, a plurality of memory devices 4221 to 422n, an auxiliary power supply 4230, and buffer memory 4240.

The controller 4210 may control the plurality of memory devices 4221 to 422n in response to signals received from the host 4100. In an embodiment, the received signals may be signals based on the interfaces of the host 4100 and the SSD 4200. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe).

Each of the plurality of memory devices 4221 to 422n may include a plurality of memory cells configured to store data. Each of the memory devices 4221 to 422n may be configured in the same manner as the memory device 100 illustrated in FIG. 1. The plurality of memory devices 4221 to 422n may communicate with the controller 4210 through channels CH1 to CHn.

The auxiliary power supply 4230 may be coupled to the host 4100 through the power connector 4002. The auxiliary power supply 4230 may be supplied with a supply voltage from the host 4100, and may be charged. The auxiliary power supply 4230 may provide the supply voltage of the SSD 4200 when the supply of power from the host 4100 is not smoothly provided. In an embodiment, the auxiliary power supply 4230 may be located inside the SSD 4200 or located outside the SSD 4200. For example, the auxiliary power supply 4230 may be located on a main board, and may provide auxiliary power to the SSD 4200.

The buffer memory 4240 may function as buffer memory of the SSD 4200. For example, the buffer memory 4240 may temporarily store data received from the host 4100 or data received from the plurality of memory devices 4221 to 422n, or may temporarily store metadata (e.g., mapping tables) of the memory devices 4221 to 422n. The buffer memory 4240 may include volatile memory, such as dynamic random-access memory (DRAM), synchronous DRAM (SDRAM), double data rate (DDR) SDRAM, and low power DDR (LPDDR) SDRAM, or nonvolatile memory, such as ferroelectric RAM (FRAM), resistive RAM (ReRAM), spin transfer torque magnetic RAM (STT-MRAM), and phase-change RAM (PRAM).

According to the present disclosure, a margin for forming contact plugs in a contact area may be secured, thus reducing the difficulty in a forming process and decreasing defects in the process.

What is claimed is:

1. A memory device, comprising:
a first select line disposed over a first cell area and over a first contact area that extends from the first cell area;
a second select line disposed over a second cell area disposed in a first direction from the first cell area;

a first separation pattern extending in a second direction intersecting the first direction between the first cell area and the second cell area;
second separation patterns extending from both ends of the first separation pattern in the first direction, and a third direction opposite the first direction, respectively; and
a third separation pattern extending from at least one of the second separation patterns in the second direction, and disposed in a direction opposite the first separation pattern with respect to the at least one second separation pattern.

2. The memory device according to claim 1, wherein the first contact area extends from the first cell area in the second direction.

3. The memory device according to claim 1, wherein a width of the first cell area in the first direction is less than a width of the first contact area in the first direction.

4. The memory device according to claim 1, wherein a width of the first contact area in the first direction is greater than a sum of a width of the first cell area in the first direction and a width of the second cell area in the first direction.

5. The memory device according to claim 1, further comprising:
a first select line contact coupled to the first select line and disposed over the first contact area.

6. The memory device according to claim 5, wherein the first select line contact is adjacent to the third separation pattern in the first direction.

7. The memory device according to claim 5, wherein the first select line contact is adjacent to the first separation pattern in the second direction.

8. The memory device according to claim 1, wherein the second select line is disposed over a second contact area extending from the second cell area in a fourth direction opposite the second direction.

9. The memory device according to claim 1, further comprising:
a third select line disposed over a third cell area that is disposed in the first direction from the second cell area, and over a third contact area extending from the third cell area in the second direction.

10. The memory device according to claim 9, wherein the at least one third separation pattern is disposed between the first contact area and the third contact area.

11. The memory device according to claim 9, wherein the third separation pattern separates the first select line from the third select line.

12. The memory device according to claim 9, wherein the second select line and the third select line are separated from each other by the first separation pattern or by the first and second separation patterns.

13. The memory device according to claim 1, wherein the first select line and the second select line are separated from each other by the first separation pattern and the second separation patterns.

14. The memory device according to claim 1, wherein the third separation pattern extends from any one of both ends of the at least one second separation pattern.

15. The memory device according to claim 1, wherein any one of both ends of the third separation pattern contacts a portion between both ends of a corresponding second separation pattern.

16. The memory device according to claim 1, wherein each of the first separation pattern, the second separation patterns, and the third separation pattern includes an insulating material.

\* \* \* \* \*